United States Patent
Beam, III (10) Patent No.: US 8,778,747 B2
(45) Date of Patent: Jul. 15, 2014

(54) REGROWN SCHOTTKY STRUCTURES FOR GAN HEMT DEVICES

(75) Inventor: Edward A. Beam, III, Plano, TX (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 38 days.

(21) Appl. No.: 13/115,913

(22) Filed: May 25, 2011

(65) Prior Publication Data
US 2012/0302178 A1    Nov. 29, 2012

(51) Int. Cl.
*H01L 21/338* (2006.01)

(52) U.S. Cl.
USPC ........... 438/167; 438/172; 257/281; 257/284; 257/E21.458; 257/E29.317

(58) Field of Classification Search
USPC .......... 438/167, 169, 170, 172; 257/280, 281, 257/284, E29.317, E21.458
See application file for complete search history.

(56) References Cited

U.S. PATENT DOCUMENTS

| | | | |
|---|---|---|---|
| 2001/0040246 A1* | 11/2001 | Ishii | 257/192 |
| 2008/0286915 A1* | 11/2008 | Dungan et al. | 438/175 |
| 2009/0072240 A1* | 3/2009 | Suh et al. | 257/76 |
| 2009/0072269 A1* | 3/2009 | Suh et al. | 257/136 |
| 2009/0078966 A1* | 3/2009 | Asai et al. | 257/194 |
| 2009/0140262 A1* | 6/2009 | Ohki et al. | 257/76 |
| 2010/0001318 A1* | 1/2010 | Bito | 257/192 |
| 2010/0072516 A1* | 3/2010 | Tamura et al. | 257/192 |
| 2011/0037100 A1* | 2/2011 | Hikita et al. | 257/190 |
| 2011/0215424 A1* | 9/2011 | Sato | 257/409 |

* cited by examiner

*Primary Examiner* — Su Kim
(74) *Attorney, Agent, or Firm* — Schwabe Williamson & Wyatt (57) ABSTRACT

Embodiments include but are not limited to apparatuses and systems including a buffer layer, a group III-V layer over the buffer layer, a source contact and a drain contact on the group III-V layer, and a regrown Schottky layer over the group III-V layer, and between the source and drain contacts. The embodiments further include methods for making the apparatuses and systems. Other embodiments may be described and claimed.

18 Claims, 13 Drawing Sheets

REGROWN SCHOTTKY STRUCTURES FOR GAN HEMT DEVICES

TECHNICAL FIELD

Embodiments of the present invention relate generally to apparatuses and systems including a high-electron mobility transistor device including a regrown Schottky layer.

BACKGROUND

High-electron mobility transistors (HEMTs) are used in a number of applications due at least in part to their simultaneous high-power, high-frequency, and low on-resistance operation. The wide-band gap characteristic of gallium nitride may provide particularly exceptional performance, with high-temperature operation capability.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be discussed and/or illustrated as multiple discrete operations in turn, in a manner that may be helpful in understanding embodiments of the present invention; however, the order of description should not be construed to imply that these operations are order dependent.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

As used herein, "coupled," along with its derivatives, may mean one or more of the following. "Coupled" may mean a direct physical or electrical coupling or connection, wherein there is no other element coupled or connected between the elements that are said to be coupled with each other. "Coupled" may also mean an indirect physical or electrical coupling or connection, where one or more other elements are coupled or connected between the elements that are said to be coupled with each other.

The description may use perspective-based descriptions such as up/down, back/front, and top/bottom. Such descriptions are merely used to facilitate the discussion and are not intended to restrict the application of embodiments of the present invention.

For the purposes of the present disclosure, the phrase "A/B" means A or B. The phrase "A and/or B" means (A), (B), or (A and B). The phrase "at least one of A, B, and C" means (A), (B), (C), (A and B), (A and C), (B and C), or (A, B and C). The phrase "(A)B" means (B) or (A and B), that is, A is an optional element. In addition, although embodiments of the present disclosure may be shown and described as including a particular number of components or elements, embodiments are not limited to any particular number of components or elements.

This disclosure is generally drawn, inter alia, to apparatuses and systems including a HEMT device including a regrown Schottky layer. In various embodiments, the HEMT device may include a buffer layer and a group III-V layer over the buffer layer. The regrown Schottky layer may be over the buffer layer such that the Schottky layer is between a source contact and a drain contact.

Figure 1:
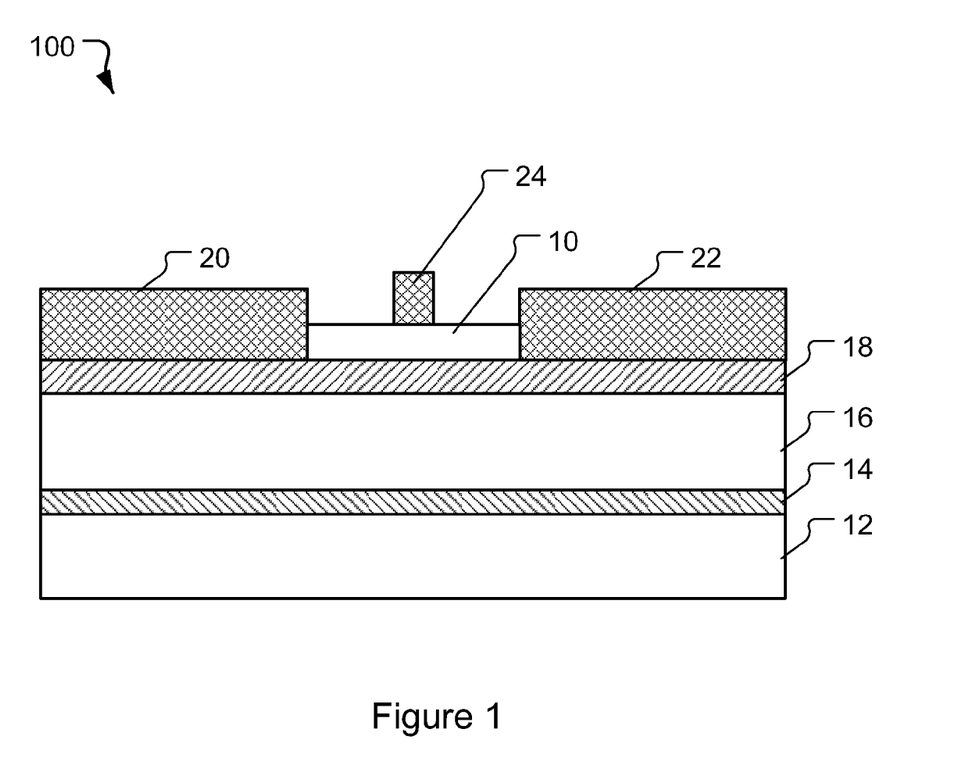
FIG. 1 is a sectional view of a HEMT including a regrown Schottky structure, in accordance with various embodiments.

FIG. 1 is a sectional view of a HEMT 100 including a regrown Schottky layer 10, in accordance with various embodiments. The HEMT 100 may include a substrate 12, a nucleation layer 14 on the substrate 12, and a buffer layer 16 on the nucleation layer. Rather than forming the regrown Schottky layer 10 directly onto the buffer layer 16, a group III-V layer 18 may be on the buffer layer 16. The illustrated HEMT 100 further includes an ohmic source contact 20, an ohmic drain contact 22, and a gate 24.

The HEMT 100 may provide a low-resistance contact structure at least in that there is low-resistance contact to the 2-dimensional electron gas (at the interface of the buffer layer 16 and the group III-V layer 18) by having direct contact to the group III-V layer 18. To that end, the group III-V layer 18 may comprise a highly-doped group III-V material. Rather than having a Schottky layer that spans across the structure such that the Schottky layer is between the ohmic contacts 20, 22 and the buffer layer 16, the Schottky layer 10 is instead regrown in the area between the gate 24 and the underlying layers (layers 18, 16, 14, 12), and between the ohmic contacts 20, 22. By providing the low-resistance path using the highly-doped n+ group III-V layer 18, it may also be possible to anneal the contacts 20, 22 at a lower temperature than would otherwise be necessary for providing good contact between the contacts 20, 22 and the n+ group III-V layer 18.

An example method for forming a HEMT device, such as, for example, HEMT device 100, is illustrated in FIGS. 2-9 by way of cross-sectional side views of the HEMT device at various stages of the method.

Figure 2:
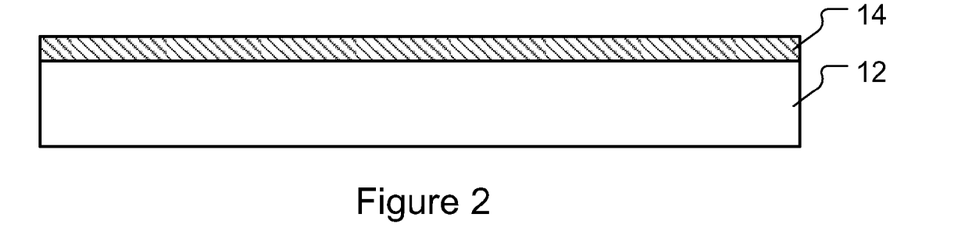
FIGS. 2-9 illustrate various stages of a method for making a HEMT including a regrown Schottky structure, in accordance with various embodiments.

As illustrated in FIG. 2, the nucleation layer 14 may be formed on the substrate 12. The substrate 12 may comprise any material suitable for the application. In various embodiments, for example, the substrate 12 comprises silicon carbide. Silicon carbide may be particularly suitable for devices having high-radio-frequency power and high-frequency operation due at least in part to the thermal and isolation properties of silicon carbide. In other embodiments, however, the substrate 12 may comprise silicon, sapphire, aluminum nitride, gallium nitride, or some combination thereof or some combination with another suitable material. During processing, the substrate 12 may be part of a wafer on which multiple devices, similar to the HEMT device 100, and/or other devices may be formed.

The nucleation layer 14 may comprise aluminum nitride or another suitable material for improving the quality of the buffer layer 16. The nucleation layer may comprise, for example, aluminum nitride. In some embodiments, the nucleation layer 14 may comprise gallium nitride or aluminum gallium nitride. In various embodiments, the nucleation layer 14 may be omitted entirely from the HEMT 100 structure.

Figure 3:
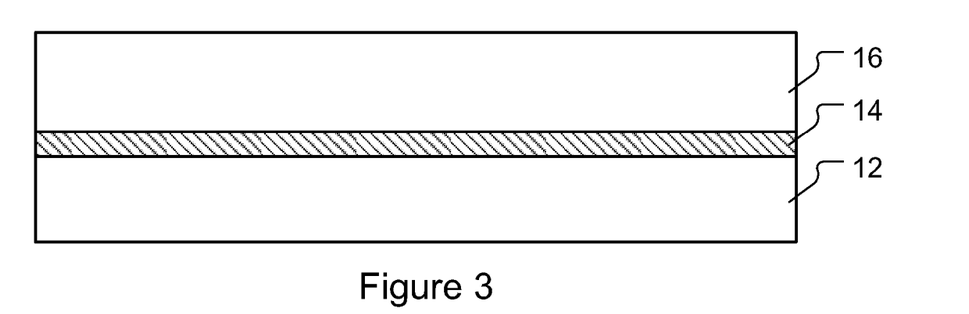
Figure 4:
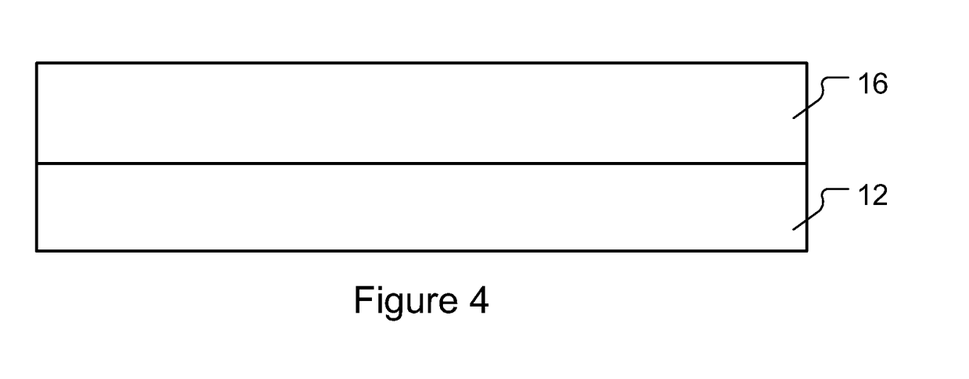

The buffer layer 16 may then be formed over the nucleation layer when present, as illustrated in FIG. 3. For embodiments in which the nucleation layer 14 is omitted, the buffer layer 16 may be formed directly on the substrate 12, as illustrated in FIG. 4.

The buffer layer 16 may comprise a suitable gallium-nitride-based material. The gallium-nitride-based material may comprise gallium nitride or aluminum gallium nitride, or a combination thereof. In various embodiments, the buffer layer 16 may be an iron- or carbon-doped gallium-nitride-based material or a superlattice gallium-nitride-based material.

Figure 5:
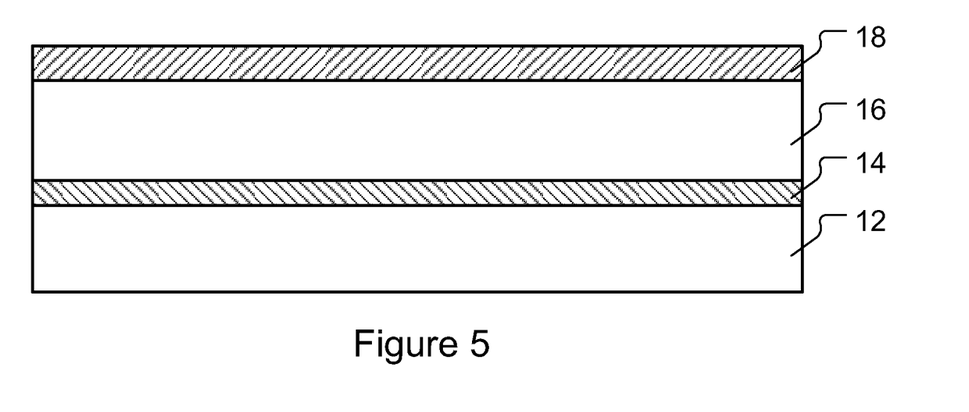

The group III-V layer 18 may be formed over the buffer layer 16, as illustrated in FIG. 5. The group III-V layer 18 may comprise n+ gallium nitride. In various other embodiments, the group III-V layer 18 may comprise n+ indium gallium nitride, n+ indium nitride, n+ indium aluminum nitride, or n+ aluminum gallium nitride. For embodiments in which the group III-V layer 18 comprises n+ aluminum gallium nitride, the thickness of the n+ aluminum gallium nitride may be a thickness in the range of 10-50 Angstroms. In various embodiments, rather than forming the group III-V layer 18, an undoped gallium nitride layer may be formed over the buffer layer 16. In various embodiments, the ohmic metal, discussed below, may be alloyed into this layer. The thickness of the undoped gallium nitride may be a thickness in the range of 10-500 Angstroms.

Figure 6:
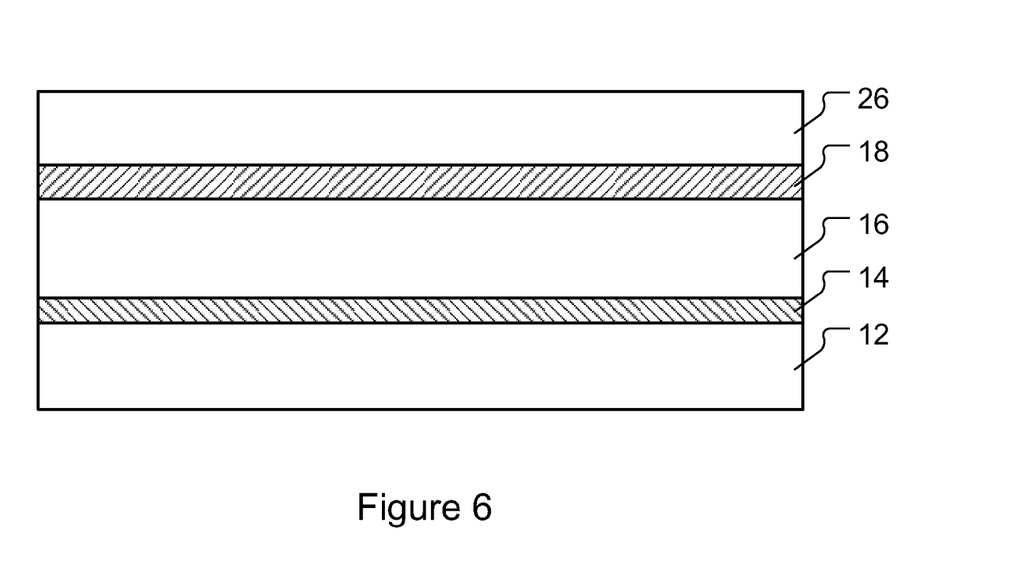
Figure 7:
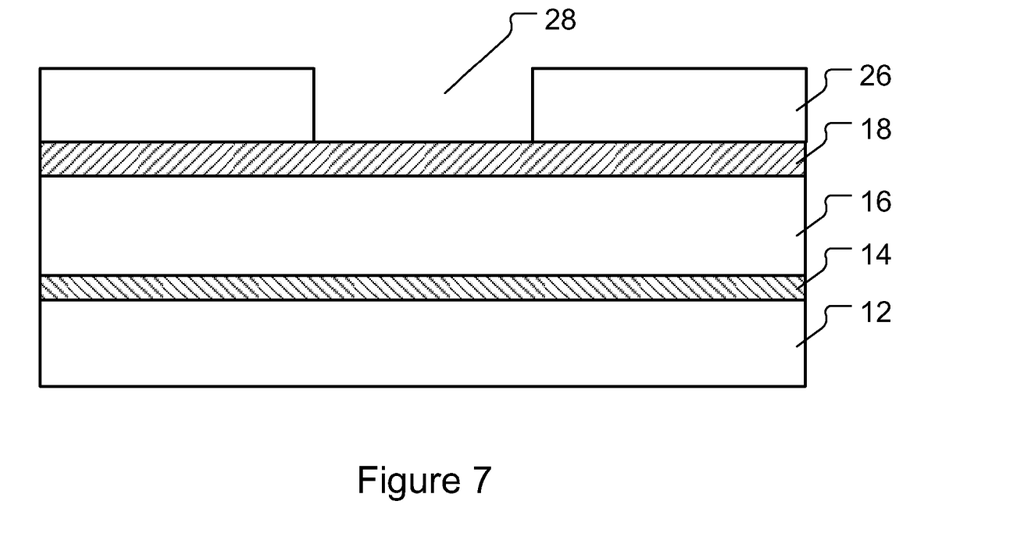

A mask layer 26 may be formed over the group III-V layer 18, as illustrated in FIG. 6. As illustrated in FIG. 7, the mask layer 26 may then be patterned to form openings 28, exposing the group III-V layer 18 where the Schottky layer 10 and any access regions of the HEMT device are to be formed. The mask layer 26 may comprise any material suitable for photolithographic patterning and etching operations. Accordingly, the material used for the mask layer 26 would generally be one that has the appropriate etch selectively relative to any other layers on the substrate 12. A hard mask may be suitable in various embodiments. Suitable hard mask materials may include silicon nitride or silicon oxide. Other known hard mask materials may be similarly suitable.

Figure 8:
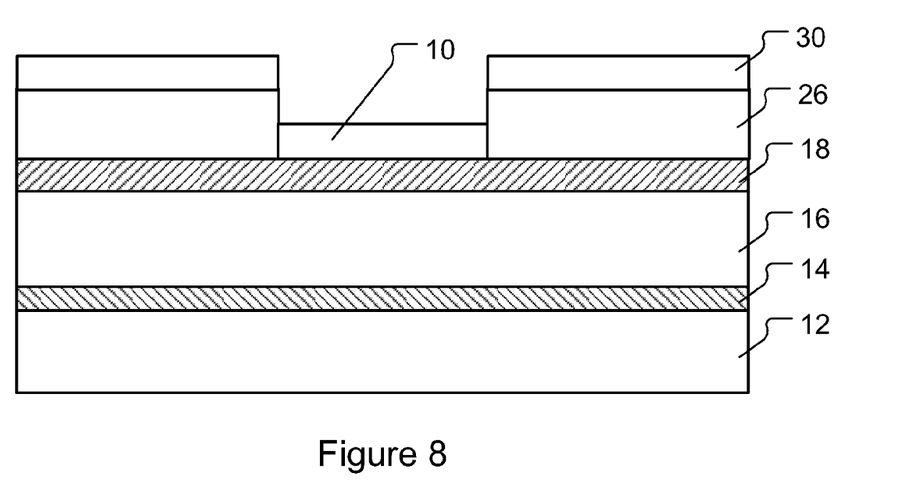

The patterned structure may then be cleaned, if desired, and then the Schottky layer 10 may be regrown, as illustrated in FIG. 8. The regrown Schottky layer 10 may be formed used any suitable method including, for example, molecular beam epitaxy, vapor-phase epitaxy, solid-phase epitaxy, or liquid-phase epitaxy may be similarly suitable. Depending on the application, the Schottky layer 10 may also be regrown on other areas of a wafer, and regrowing the Schottky layer 10 as described herein may allow for multiple regrowths, remasking as needed, with different Schottky structures on the same wafer for enhancement- and depletion-mode HEMTs.

In various embodiments, the regrown Schottky layer 10 comprises an epitaxial material. The regrown Schottky layer 10 may comprise gallium nitride, aluminum gallium nitride, indium aluminum nitride, aluminum nitride, indium gallium nitride, gallium boron nitride, or aluminum boron nitride, or a combination of two or more thereof.

Depending on the epitaxial material regrown for forming the regrown Schottky layer 10, a polycrystalline layer 30 may form over the mask layer 26 during the regrowth operation, as also illustrated in FIG. 8.

Figure 9:
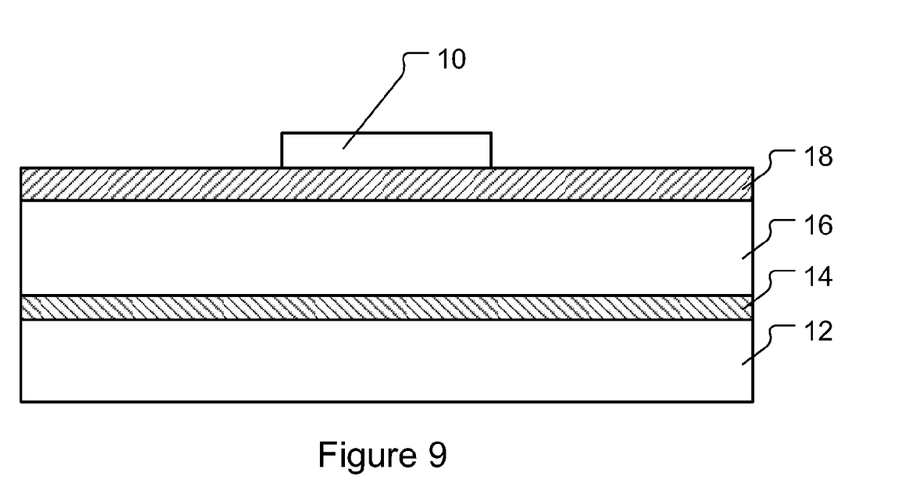
Figure 10:
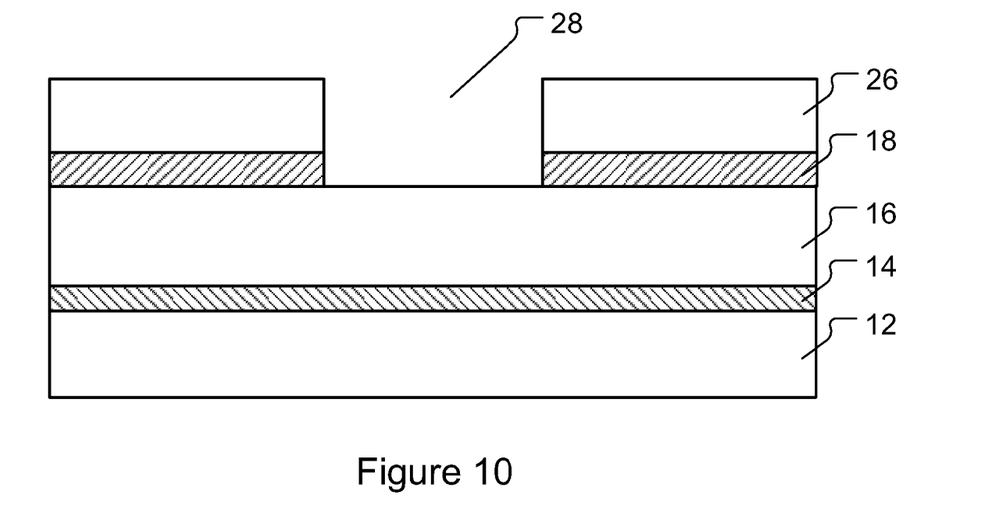
FIGS. 10-13 illustrate various stages of another method for making a HEMT including a regrown Schottky structure, in accordance with various embodiments.

The mask layer 26 and polycrystalline layer 30, if present, may then be removed using a suitable etch operation, leaving the regrown Schottky layer 10, as illustrated in FIG. 9.

Device processing may continue with gate 24 definition and metallization on the regrown Schottky layer 10, and ohmic metallization for forming the source contact 20 and the drain contact 22 on the remaining group III-V layer 18 regions to form the HEMT device 100, as illustrated in FIG. 1. The gate 24, source contact 20, and drain contact 22 may comprise any suitable material including, for example, a suitable metal.

Although not illustrated here, the HEMT 100 may include additional layers depending on the application.

In various embodiments, the group III-V layer 18 may be etched prior to forming the Schottky layer 10, as illustrated by the method of FIGS. 10-13. As illustrated, after forming the mask layer 26 over the group III-V layer 18 (by operations described with reference to FIGS. 2-7, for example), the group III-V layer 18 is etched through the opening 28 to remove or reduce the thickness of the group III-V layer 18. The buffer layer 16 may also be etched during this or an additional operation.

Figure 11:
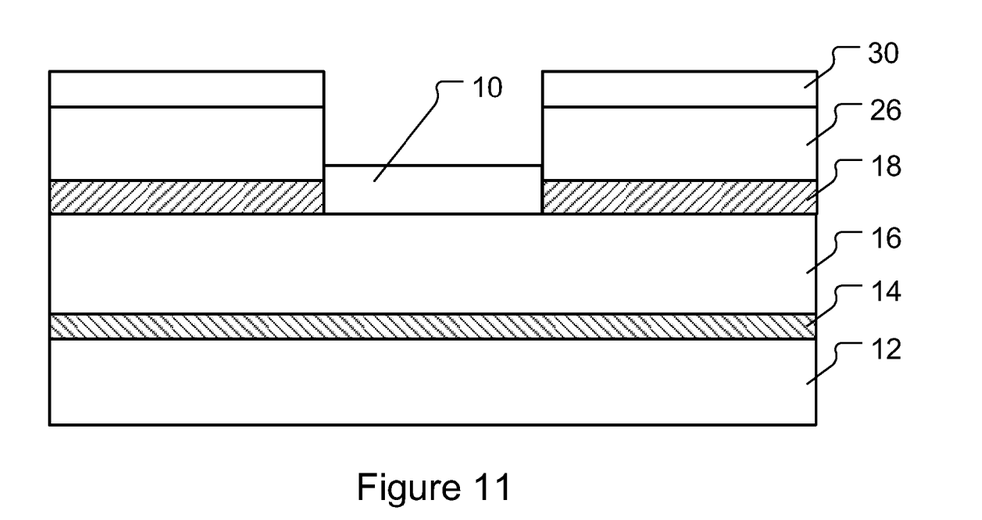

After etching the group III-V layer 18, the patterned structure may be cleaned, if desired, and then the Schottky layer 10 may be regrown directly on the buffer layer 16, as illustrated in FIG. 11. The regrown Schottky layer 10 may be formed used any suitable method including, for example, molecular beam epitaxy, vapor-phase epitaxy, solid-phase epitaxy, or liquid-phase epitaxy may be similarly suitable. Depending on the application, the Schottky layer 10 may also be regrown on other areas of a wafer, and regrowing the Schottky layer 10 as described herein may allow for multiple regrowths, remasking as needed, with different Schottky structures on the same wafer for enhancement- and depletion-mode HEMTs.

In various embodiments, the regrown Schottky layer 10 comprises an epitaxial material. The regrown Schottky layer 10 may comprise gallium nitride, aluminum gallium nitride, indium aluminum nitride, aluminum nitride, indium gallium nitride, gallium boron nitride, or aluminum boron nitride, or a combination of two or more thereof.

Depending on the epitaxial material regrown for forming the regrown Schottky layer 10, a polycrystalline layer 30 may be formed over the mask layer 26 during the regrowth operation, as also illustrated in FIG. 11.

Figure 12:
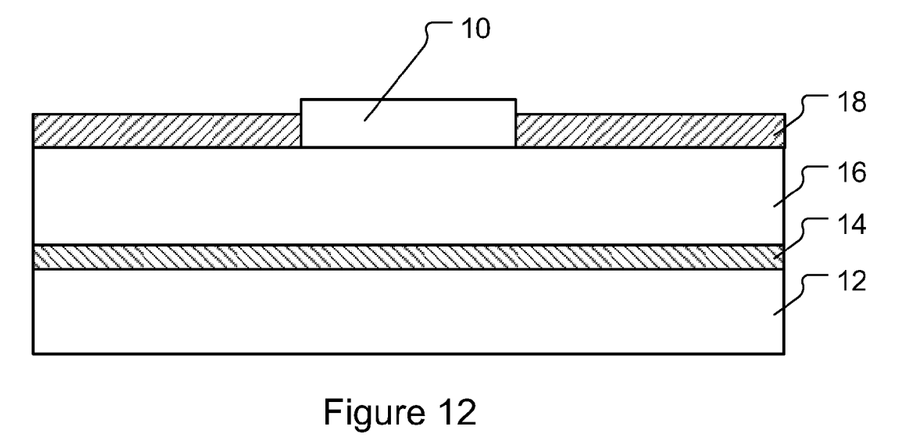

The mask layer 26 and polycrystalline layer 30, if present, may then be removed using a suitable etch operation, leaving the regrown Schottky layer 10, as illustrated in FIG. 12.

Figure 13:
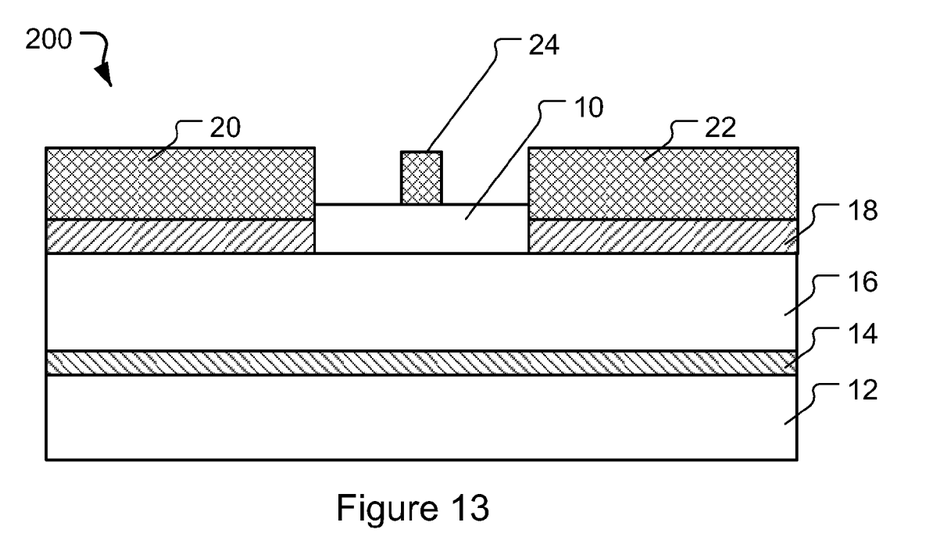

Device processing may continue with gate 24 definition and metallization on the regrown Schottky layer 10, and ohmic metallization for forming the source contact 20 and the drain contact 22 on the remaining group III-V layer 18 regions to form the HEMT device 200, as illustrated in FIG.

13. The gate 24, source contact 20, and drain contact 22 may comprise any suitable material including, for example, a suitable metal.

Although not illustrated here, the HEMT 200 may include additional layers depending on the application.

In various embodiments, one or more etch stop layers may be used for facilitating the etch operation(s), as illustrated by the example method for forming a HEMT device in FIGS. 14-21. For the described embodiments, the etch stop layer 32 may help prevent etching of the buffer layer 16 when etching the group III-V layer 18. In other words, when the group III-V layer 18 is etched through the opening 28, the etch may be stopped or slowed by the etch stop layer 32.

Figure 14:
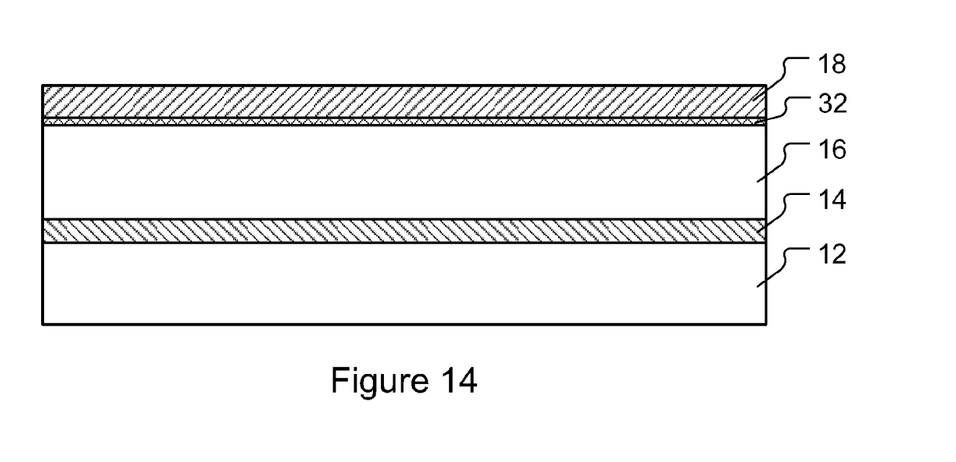
FIGS. 14-21 illustrate various stages of another method for making a HEMT including a regrown Schottky structure, in accordance with various embodiments.

As illustrated in FIG. 14, an etch stop layer 32 may be formed over the buffer layer 16, prior to forming the group III-V layer 18, such that the etch stop layer 32 is between the buffer layer 16 and the group III-V layer 18.

The etch stop layer 32 may comprise any material suitable for the purpose. In various embodiments, the etch stop layer 32 may comprise indium gallium nitride, aluminum nitride, or any other suitable material.

Figure 15:
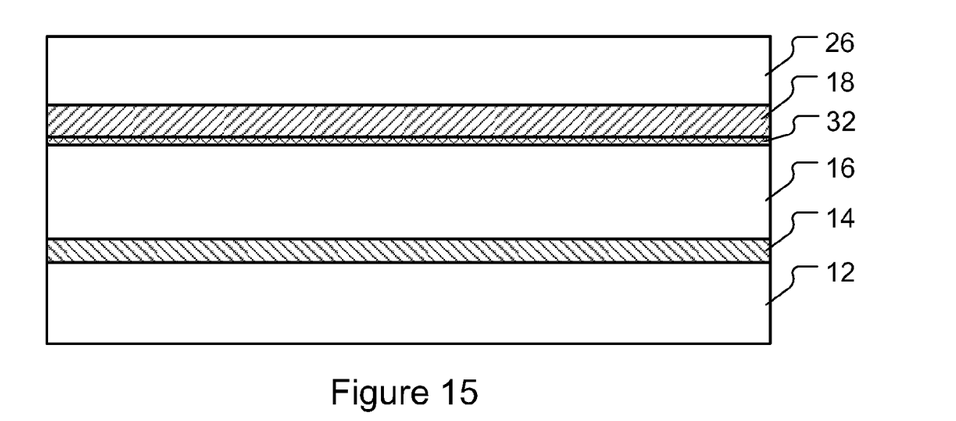
Figure 16:
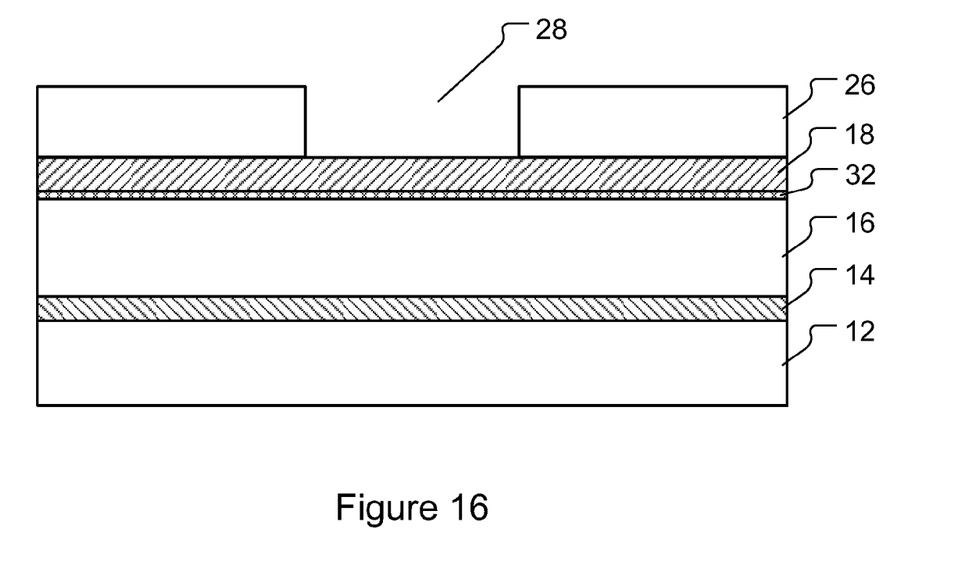

A mask layer 26 may then be formed over the group III-V layer 18, as illustrated in FIG. 15. As illustrated in FIG. 16, the mask layer 26 may then be patterned to form openings 28, exposing the group III-V layer 18 where the Schottky layer 10 and any access regions of the HEMT device are to be formed. The mask layer 26 may comprise any material suitable for photolithographic patterning and etching operations. Accordingly, the material used for the mask layer 26 would generally be one that has the appropriate etch selectively relative to any other layers on the substrate 12. In some embodiments, a hard mask may be suitable. Suitable hard mask materials may include silicon nitride or silicon oxide. Other known hard mask materials may be similarly suitable.

Figure 17:
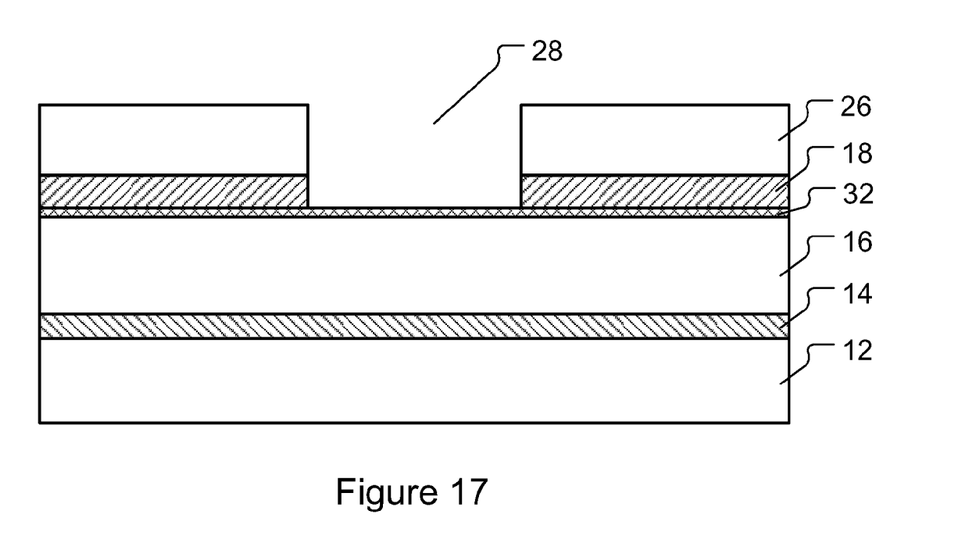
Figure 18:
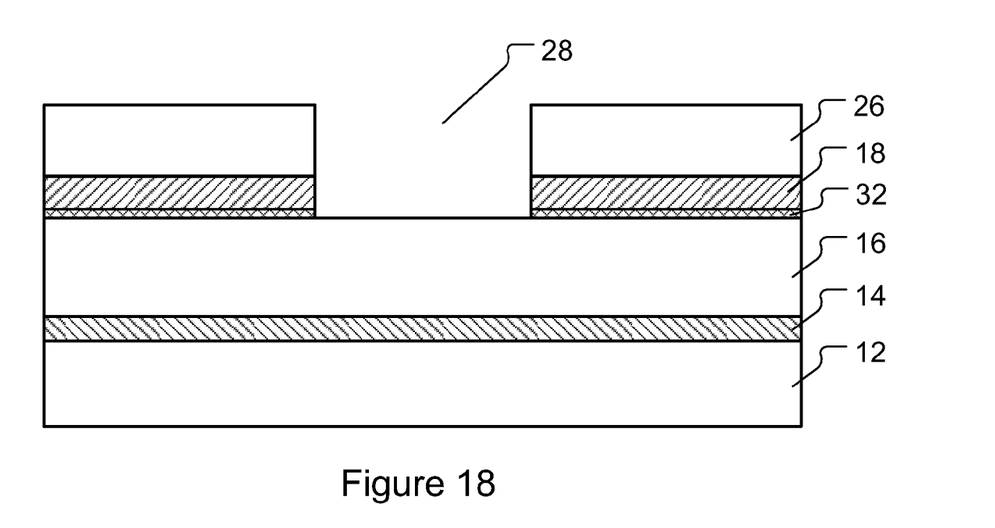

As illustrated in FIG. 17, after forming the mask layer 26 over the group III-V layer 18, the group III-V layer 18 is etched through the opening 28 to etch the group III-V layer 18. The etch stop layer 32 may then be removed to expose the group III-V layer 18 as illustrated in FIG. 18. The etching of the group III-V layer 18 and the etching of the etch stop layer 32 may be performed in a single etch operation or in multiple etch operations.

Figure 19:
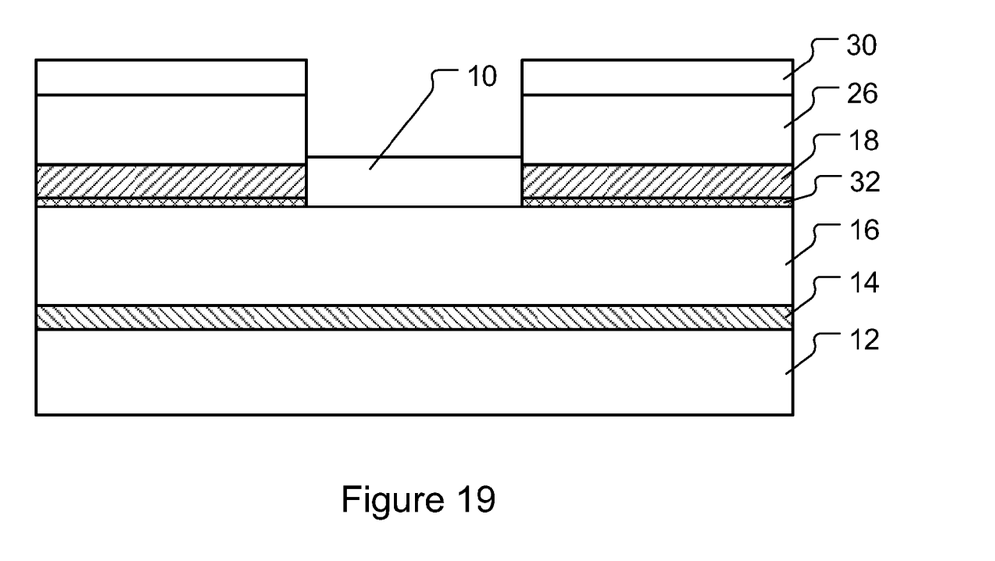

The patterned structure may then be cleaned, if desired, and then the Schottky layer 10 may be regrown directly on the buffer layer 16, as illustrated in FIG. 19, or on the etch stop layer 32 if the etch stop layer 32 is not removed. The regrown Schottky layer 10 may be formed used any suitable method including, for example, molecular beam epitaxy, vapor-phase epitaxy, solid-phase epitaxy, or liquid-phase epitaxy may be similarly suitable. Depending on the application, the Schottky layer 10 may also be regrown on other areas of a wafer, and regrowing the Schottky layer 10 as described herein may allow for multiple regrowths, remasking as needed, with different Schottky structures on the same wafer for enhancement- and depletion-mode HEMTs.

In various embodiments, the regrown Schottky layer 10 comprises an epitaxial material. The regrown Schottky layer 10 may comprise gallium nitride, aluminum gallium nitride, indium aluminum nitride, aluminum nitride, indium gallium nitride, gallium boron nitride, or aluminum boron nitride, or a combination of two or more thereof.

Depending on the epitaxial material regrown for forming the regrown Schottky layer 10, a polycrystalline layer 30 may form over the mask layer 26 during the regrowth operation, as also illustrated in FIG. 19.

Figure 20:
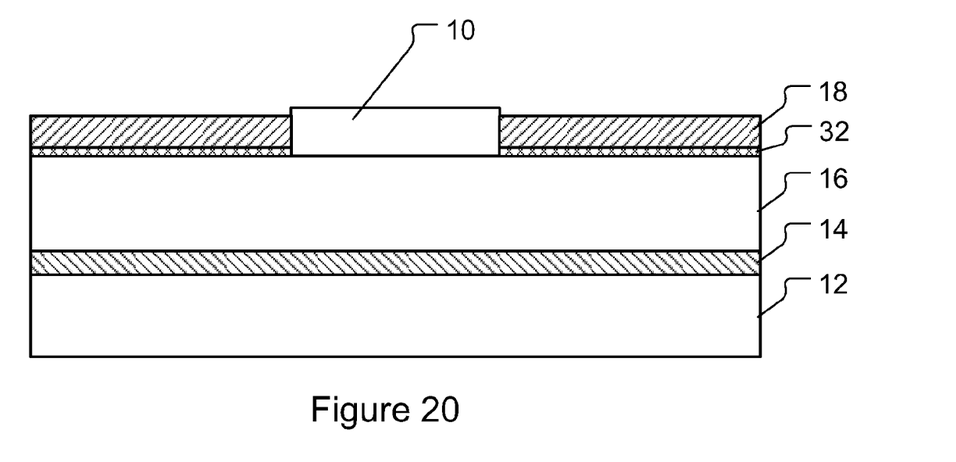

The mask layer 26 and polycrystalline layer 30, if present, may then be removed using a suitable etch operation, leaving the regrown Schottky layer 10, as illustrated in FIG. 20.

Figure 21:
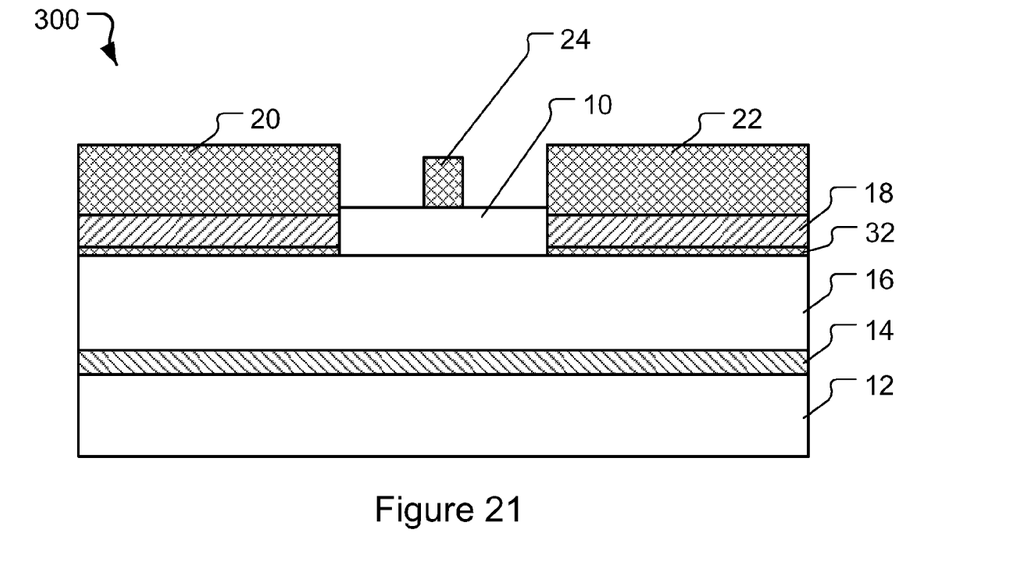

Device processing may continue with gate 24 definition and metallization on the regrown Schottky layer 10, and ohmic metallization for forming the source contact 20 and the drain contact 22 on the remaining group III-V layer 18 regions to form the HEMT device 300, as illustrated in FIG. 21. The gate 24, source contact 20, and drain contact 22 may comprise any suitable material including, for example, a suitable metal or a suitable metal over a regrown n+ contact layer.

Although not illustrated here, the HEMT 300 may include additional layers depending on the application.

Figure 22:
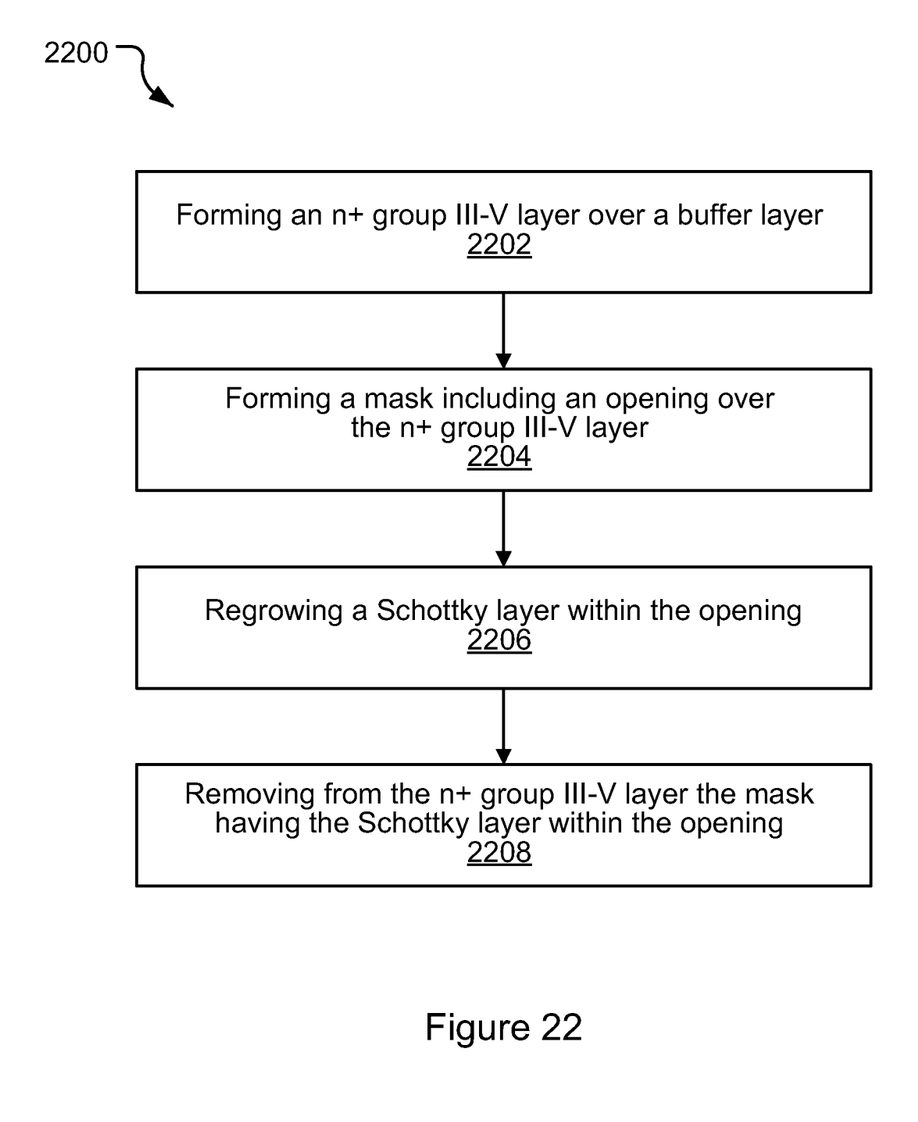
FIG. 22 is a flow diagram of some of the operations associated with a method for making a HEMT including a regrown Schottky structure, in accordance with various embodiments.

FIG. 22 is a flow diagram of some of the operations associated with a method 2200 for making a HEMT including a regrown Schottky structure (HEMT device 100, 200, or 300, for example), in accordance with various embodiments.

Turning now to FIG. 22, the method 2200 may include one or more functions, operations, or actions as is illustrated by block 2202, block 2204, block 2206, and/or block 2208. Processing for the method 2200 may start with block 2202 by forming a group III-V layer over a buffer layer. The buffer layer may be formed on a substrate, and the substrate may include a nucleation layer thereon. The buffer layer may comprise a suitable gallium-nitride-based material including, for example, gallium nitride or aluminum gallium nitride, or a combination thereof, an iron- or carbon-doped gallium-nitride-based material, or a superlattice gallium-nitride-based material. The group III-V layer may comprise n+ gallium nitride such as, for example, n+ indium gallium nitride, n+ indium nitride, n+ indium aluminum nitride, or n+ aluminum gallium nitride.

From block 2202, the method 2200 may proceed to block 2204 by forming a mask including an opening over the group III-V layer. The mask layer may comprise any material suitable for photolithographic patterning and etching operations including, for example, silicon nitride. The opening may be formed by a suitable etch operation. The opening may extend to the group III-V layer.

From block 2204, the method 2200 may proceed to block 2206 by regrowing a Schottky layer within the opening. The Schottky layer may be regrown using any suitable method including, for example, molecular beam epitaxy, vapor-phase epitaxy, solid-phase epitaxy, or liquid-phase epitaxy. In various embodiments, the regrown Schottky layer comprises an epitaxial material such as gallium nitride, aluminum gallium nitride, indium aluminum nitride, aluminum nitride, indium gallium nitride, gallium boron nitride, or aluminum boron nitride, or a combination of two or more thereof.

From block 2206, the method 2200 may proceed to block 2208 by removing from the group III-V layer the mask having the Schottky layer within the opening.

Although not illustrated in the flow diagram, the method 2200 may further include forming a source contact on the group III-V layer and abutting the Schottky layer, and forming a drain contact on the of the group III-V layer and abutting the Schottky layer such that the Schottky layer is between the source contact and the drain contact.

Figure 23:
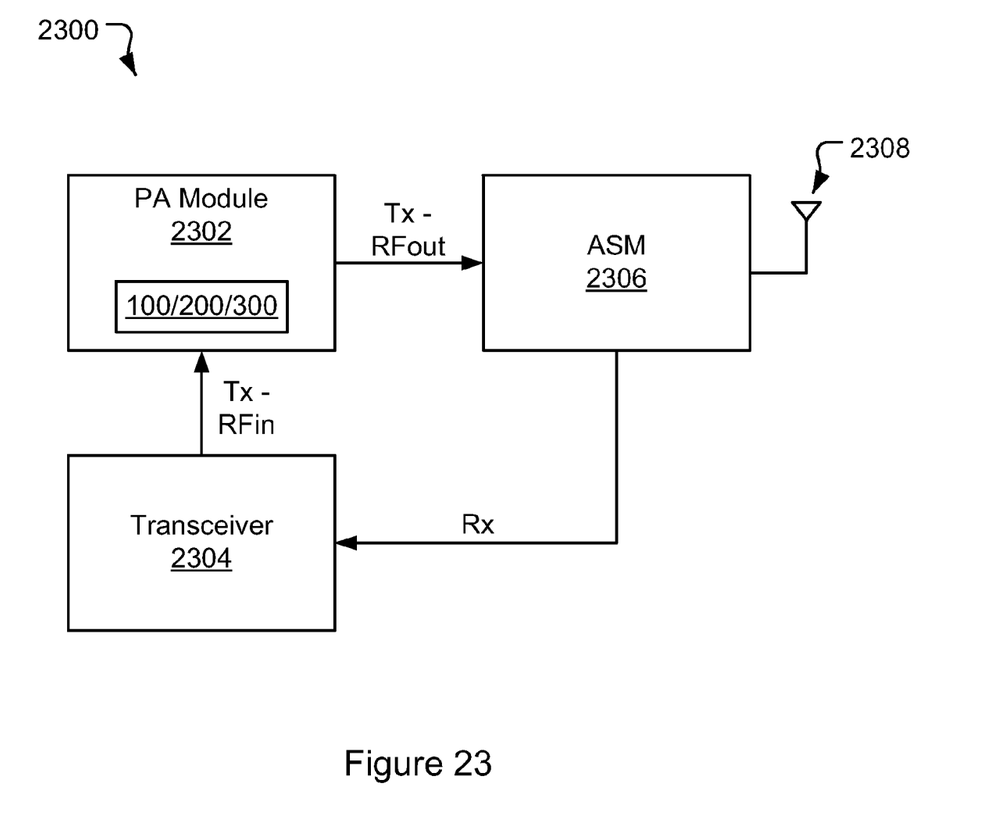
FIG. 23 is a block diagram of a system incorporating a package including a HEMT including a regrown Schottky structure, in accordance with various embodiments.

Embodiments of HEMTs described herein, and apparatuses including such HEMTs, may be incorporated into various other apparatuses and systems. A block diagram of an example system 2300 is illustrated in FIG. 23. For example, the power amplifier module 2302 may include one or more of the HEMTs 100, 200, 300 including a Schottky layer described herein. As illustrated, the system 2300 includes an RF power amplifier module 2302. The system 2300 may include a transceiver 2304 coupled with the RF power amplifier module 2302 as illustrated.

The RF power amplifier module 2302 may receive an RF input signal, RFin, from the transceiver 2304. The RF power amplifier module 2304 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 23.

The amplified RF output signal, RFout, may be provided to an antenna switch module (ASM) 2306, which effectuates an over-the-air (OTA) transmission of the RF output signal, RFout, via an antenna structure 2308. The ASM 2306 may also receive RF signals via the antenna structure 2308 and couple the received RF signals, Rx, to the transceiver 2304 along a receive chain.

In various embodiments, the antenna structure 2308 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 2300 may be any system including power amplification. In various embodiments, the system 2300 may be particularly useful for power amplification at high radio-frequency power and frequency. For example, the system 2300 may be suitable for any one or more of terrestrial and satellite communications, radar systems, and possibly in various industrial and medical applications. More specifically, in various embodiments, the system 2300 may be a selected one of a radar device, a satellite communication device, a mobile handset, a cellular telephone base station, a broadcast radio, or a television amplifier system.

Although the present disclosure has been described in terms of the above-illustrated embodiments, it will be appreciated by those of ordinary skill in the art that a wide variety of alternate and/or equivalent implementations calculated to achieve the same purposes may be substituted for the embodiments shown and described without departing from the scope of the present disclosure. Those with skill in the art will readily appreciate that embodiments in accordance with the present disclosure may be implemented in a very wide variety of embodiments. This description is intended to be regarded as illustrative instead of restrictive.

What is claimed is:

1. A method comprising:
    forming a group III-V layer over a buffer layer;
    forming a mask over the group III-V layer, the mask including an opening to expose the group III-V layer;
    etching the exposed group III-V layer through the opening to expose the buffer layer;
    regrowing a non-metallic Schottky layer within the opening to form a regrown non-metallic Schottky layer; and
    after regrowing the non-metallic Schottky layer, removing, from the group III-V layer, the mask.

2. The method of claim 1, wherein the group III-V layer comprises an n+ group III-V material.

3. The method of claim 2, wherein the group III-V layer comprises n+ gallium nitride, n+ indium gallium nitride, n+ indium nitride, n+ indium aluminum nitride, or n+ aluminum gallium nitride.

4. The method of claim 1, wherein the group III-V layer comprises an undoped group III-V material.

5. The method of claim 1, wherein the opening extends to the group III-V layer, and wherein the regrowing comprises regrowing the non-metallic Schottky layer within the opening and on the group III-V layer to form the regrown non-metallic Schottky layer.

6. The method of claim 1, wherein the regrowing the non-metallic Schottky layer comprises regrowing the non-metallic Schottky layer on the exposed buffer layer.

7. The method of claim 1, wherein the forming the group III-V layer comprises forming the group III-V on an etch stop layer disposed on the buffer layer, and wherein the etching comprises etching the group III-V layer and the etch stop layer through the opening to expose the buffer layer.

8. The method of claim 7, further comprising etching the buffer layer through the opening.

9. The method of claim 1, further comprising forming a source contact on the group III-V layer and abutting the regrown non-metallic Schottky layer, and forming a drain contact on the group III-V layer and abutting the regrown non-metallic Schottky layer such that the regrown non-metallic Schottky layer is between the source contact and the drain contact.

10. The method of claim 1, wherein the regrown non-metallic Schottky layer is formed through the group III-V layer such that a first side and a second side of the regrown non-metallic Schottky layer abut the group III-V layer.

11. An apparatus comprising:
    a buffer layer;
    a group III-V layer over the buffer layer, the group III-V layer including an etched opening to expose the buffer layer;
    a source contact and a drain contact on the group III-V layer; and
    a regrown Schottky layer within the etched opening of the group III-V layer and between the source and drain contacts;
    wherein the regrown Schottky layer is in direct contact with the buffer layer, the source contact abuts the regrown Schottky layer, and the drain contact abuts the regrown Schottky layer.

12. The apparatus of claim 11, wherein the group III-V layer comprises n+ gallium nitride, n+ indium gallium nitride, n+ indium nitride, n+ indium aluminum nitride, or n+ aluminum gallium nitride.

13. The apparatus of claim 11, wherein the regrown Schottky layer comprises at least one of gallium nitride, aluminum gallium nitride, indium aluminum nitride, aluminum nitride, indium gallium nitride, gallium boron nitride, indium boron nitride, or aluminum boron nitride.

14. The apparatus of claim 11, wherein the group III-V layer comprises an undoped group III-V material.

15. A system comprising:
    an antenna switch module configured to receive radio frequency (RF) output signals;
    a transceiver coupled with the antenna switch module and configured to generate RF input signals; and
    a power amplifier module coupled with the antenna switch module and the transceiver, and configured to receive the RF input signals from the transceiver and to provide RF output signals to the antenna switch module, wherein the power amplifier module includes a high electron mobility transistor having:
        a buffer layer;
        a group III-V layer over the buffer layer, the group III-V layer including an etched opening to expose the buffer layer;
        a source contact and a drain contact on the group III-V layer; and a regrown Schottky layer within the etched opening of the group III-V layer and between the source and drain contacts;

wherein the regrown Schottky layer is in direct contact with the buffer layer the source contact abuts the regrown Schottky layer, and the drain contact abuts the regrown Schottky layer.

16. The system of claim 15 wherein the system is a radar device, a satellite communication device, a mobile handset, a base station, a broadcast radio, or a television amplifier system.

17. The apparatus of claim 11, wherein the source contact and drain contact abut the regrown Schottky layer in a same lateral plane as one another.

18. The system of claim 15, wherein the regrown Schottky layer is a non-metallic Schottky layer, and wherein the source contact and drain contact abut the regrown Schottky layer in a same lateral plane as one another.

* * * * *